United States Patent
Pasqualini

(10) Patent No.: US 7,996,805 B2
(45) Date of Patent: Aug. 9, 2011

(54) METHOD OF STITCHING SCAN FLIPFLOPS TOGETHER TO FORM A SCAN CHAIN WITH A REDUCED WIRE LENGTH

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 884 days.

(21) Appl. No.: 12/008,163

(22) Filed: Jan. 8, 2008

(65) Prior Publication Data

US 2009/0174451 A1    Jul. 9, 2009

(51) Int. Cl.
    *G06F 17/50*    (2006.01)
(52) U.S. Cl. ........ 716/124; 716/125; 716/129; 716/130; 716/131
(58) Field of Classification Search .............. 716/9, 10, 716/13, 14, 18, 119, 122, 123, 124, 125, 716/129, 130, 131
    See application file for complete search history.

(56) References Cited

U.S. PATENT DOCUMENTS

| | | | |
|---|---|---|---|
| 5,402,156 A | 3/1995 | Donahue et al. .......... 346/139 D |
| 5,420,409 A | 5/1995 | Longacre, Jr. et al. ....... 235/462 |
| 5,444,231 A | 8/1995 | Shellhammer et al. ....... 235/462 |
| 5,457,308 A | 10/1995 | Spitz et al. ..................... 235/462 |
| 5,495,097 A | 2/1996 | Katz et al. ..................... 235/462 |
| 5,569,902 A | 10/1996 | Wood et al. .................... 235/472 |
| 5,723,853 A | 3/1998 | Longacre, Jr. et al. ....... 235/472 |
| 5,732,246 A * | 3/1998 | Gould et al. ..................... 326/38 |
| 5,748,647 A * | 5/1998 | Bhattacharya et al. ........ 714/726 |
| 5,786,586 A | 7/1998 | Pidhirny et al. ................ 235/472 |
| 5,821,519 A | 10/1998 | Lee et al. ........................ 235/462 |
| 5,959,285 A | 9/1999 | Schuessler ............... 235/462.04 |
| 5,983,376 A | 11/1999 | Narayanan et al. ............ 714/726 |
| 6,037,584 A | 3/2000 | Johnson et al. ................ 250/235 |
| 6,045,047 A | 4/2000 | Pidhirny et al. ............ 235/472.01 |
| 6,167,151 A | 12/2000 | Albeck et al. .................. 382/154 |
| 6,389,566 B1 | 5/2002 | Wagner et al. ................. 714/726 |
| 6,438,263 B2 | 8/2002 | Albeck et al. .................. 382/154 |
| 6,788,471 B2 | 9/2004 | Wagner et al. ................. 359/649 |
| 6,957,403 B2 | 10/2005 | Wang et al. ..................... 716/3 |
| 6,959,426 B2 * | 10/2005 | Xiang et al. .................... 716/103 |
| 7,127,695 B2 | 10/2006 | Huang et al. ..................... 716/10 |
| 7,188,330 B2 | 3/2007 | Goyal ............................. 716/18 |
| 7,194,706 B2 * | 3/2007 | Adkisson et al. ................ 716/56 |
| 7,376,915 B1 * | 5/2008 | Duewer et al. ................ 716/119 |
| 7,509,611 B2 * | 3/2009 | Fredrickson et al. ......... 716/119 |
| 7,546,561 B2 * | 6/2009 | Pouarz et al. .................. 716/103 |
| 7,555,741 B1 * | 6/2009 | Milton et al. .................. 716/101 |
| 7,653,849 B1 * | 1/2010 | Tabatabaei .................... 714/726 |
| 7,721,171 B2 * | 5/2010 | Erle et al. ...................... 714/729 |
| 7,721,172 B2 * | 5/2010 | Wang et al. .................... 714/729 |

(Continued)

FOREIGN PATENT DOCUMENTS

| | | | |
|---|---|---|---|
| JP | 2000137741 A | * | 5/2000 |
| JP | 2004077356 A | * | 3/2004 |

*Primary Examiner* — Phallaka Kik
(74) *Attorney, Agent, or Firm* — Mark C. Pickering

(57) ABSTRACT

The scan flipflops on a semiconductor chip are stitched together to form one or more scan chains, located in one or more standard cell placement regions, after the optimal physical location of each scan flip-flop has been determined. As a result, the total length of the scan chain wires is substantially reduced, thereby reducing on-chip wiring congestion, flip-flop load capacitance, and flipflop power dissipation.

18 Claims, 11 Drawing Sheets

U.S. PATENT DOCUMENTS

| | | |
|---|---|---|
| 2002/0032898 A1* | 3/2002 | Souef et al. ................... 716/18 |
| 2002/0157082 A1* | 10/2002 | Shau ............................ 716/19 |
| 2002/0194558 A1* | 12/2002 | Wang et al. .................. 714/718 |
| 2005/0091622 A1* | 4/2005 | Pappu et al. ..................... 716/6 |
| 2006/0026472 A1* | 2/2006 | Adkisson et al. ............. 714/726 |
| 2006/0075315 A1* | 4/2006 | Cruz et al. ................... 714/726 |
| 2006/0150136 A1* | 7/2006 | Bratt et al. .................... 716/12 |
| 2007/0094629 A1* | 4/2007 | Alter et al. .................... 716/11 |
| 2007/0186199 A1* | 8/2007 | Fredrickson et al. ............. 716/7 |
| 2007/0186204 A1* | 8/2007 | Fredrickson et al. ........... 716/18 |
| 2008/0195991 A1* | 8/2008 | Duewer et al. ................. 716/12 |
| 2009/0178014 A1* | 7/2009 | Fredrickson et al. ............. 716/2 |

* cited by examiner

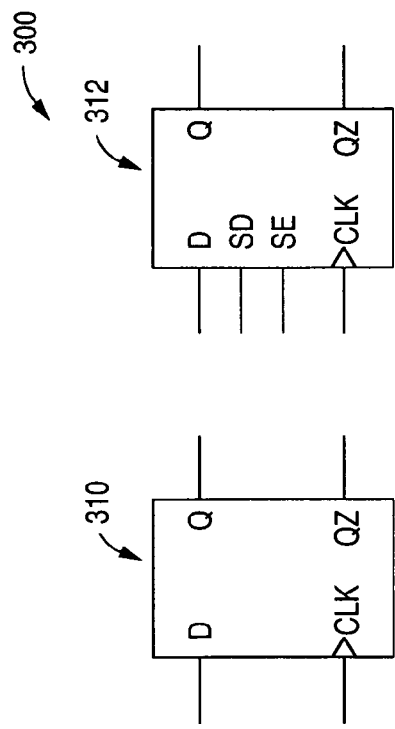
FIG. 3A
(PRIOR ART)
FIG. 3B
(PRIOR ART)
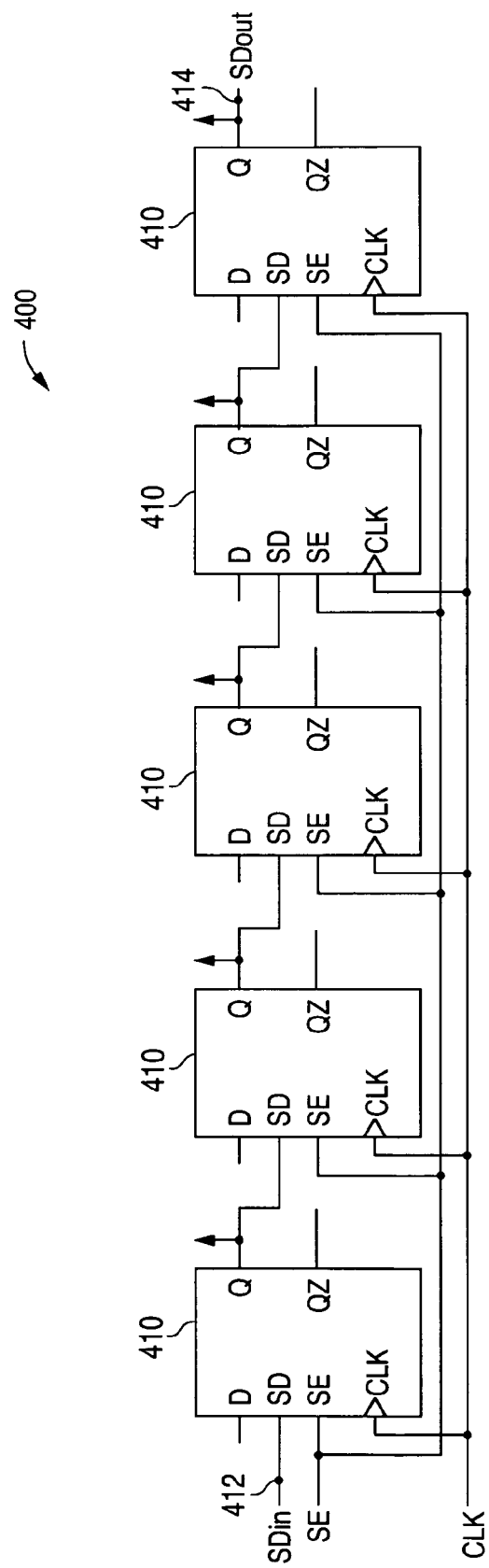
FIG. 4
(PRIOR ART)

METHOD OF STITCHING SCAN FLIPFLOPS TOGETHER TO FORM A SCAN CHAIN WITH A REDUCED WIRE LENGTH

BACKGROUND OF THE INVENTION

1. Field of the Invention

The present invention relates to scan chain stitching, and more particularly, to a method of stitching scan flipflops together to form a scan chain with a reduced wire length.

2. Description of the Related Art

Many modern day CMOS chips contain extremely complex logic functions. As a result, it is very difficult to test these chips because they often contain many thousands of flipflops that can assume many millions of logic states. Furthermore, in order to efficiently test a chip, the logic states of the chip must be easily controllable and observable. In other words, all of the flipflop outputs on a chip must be easily controllable, and these same outputs must also be easily observable. This controllability/observability, in turn, allows a complex state-dependent test problem to be reduced to a much simpler combinatorial test problem.

Flipflops are well-known logic elements that receive a data signal and a clock signal, and then retain and output the logic state of the data signal in response to an edge of the clock signal. Flipflops can respond to either the rising edge, or the falling edge, of the clock signal. Furthermore, a well-known type of flipflop is a rising-edge-triggered CMOS D flip-flop.

FIG. 1 shows an example of a prior-art circuit schematic for a rising-edge-triggered CMOS D flipflop 100. Referring to FIG. 1, flipflop 100 contains a master latch 110, a slave latch 112, and a clock inverter U1. Furthermore, except for the transistor sizes, the circuit topologies of master latch 110 and slave latch 112 are identical. This latch topology consists of two transmission gates and two inverters.

Referring to FIG. 1, when the clock input signal CLK is low, master latch transmission gate X1 will be in its turned-on state, and master latch transmission gate X2 will be in its turned-off state. Furthermore, when the clock input signal CLK is low, slave latch transmission gate X4 will be in its turned-on state, and slave latch transmission gate X3 will be in its turned-off state. Thus, when the clock input signal CLK is low, the flipflop data input DIN will be connected to the D1 input of master latch 110, and the D1Z output of master latch 110 will be disconnected from the D2Z input of slave latch 112.

In addition, when the clock input signal CLK is high, master latch transmission gate X1 will be in its turned-off state, and master latch transmission gate X2 will be in its turned-on state. Furthermore, when the clock input signal CLK is high, slave latch transmission gate X4 will be in its turned-off state, and slave latch transmission gate X3 will be in its turned-on state. Thus, when the clock input signal CLK is high, the flipflop data input DIN will be disconnected from the D1 input of master latch 110, and the master latch D1Z output will be connected to the D2Z input of slave latch 112.

As a result of the aforementioned transmission gate states, when the clock input signal CLK goes from low to high, the flipflop Q output can change state, indicating that flipflop 100 is a rising-edge-triggered flip-flop.

A serious shortcoming of flipflop 100 in FIG. 1 is that it cannot be easily tested. In other words, the flipflop output cannot be easily controlled (forced high or low) because the flipflop input DIN is connected to internal logic gates. As a consequence of this, flipflop 100 cannot be directly driven by on-chip test logic.

As well established in the prior art, a CMOS scan flipflop includes circuitry that receives additional input signals, allowing the flipflop output to be easily controlled and observed. Furthermore, a well-known type of scan flipflop is a scan-enabled rising-edge-triggered CMOS D flip-flop.

FIG. 2 shows an example of the circuit schematic for a prior-art scan-enabled rising-edge-triggered CMOS D flip-flop 200. Flipflop 200 is similar to flipflop 100 and, as a result, utilizes the same reference numerals to designate the structures that are common to both flipflops. Referring to FIG. 2, flipflop 200 differs from flipflop 100 in that flipflop 200 includes a scan multiplexer (scan mux) 210.

As shown in FIG. 2, scan mux 210 consists of two transmission gates X5 and X6, and an inverter U6. In addition, scan mux 210 also has three inputs: a data input D, a scan enable input SE, and a scan data input SD. Furthermore, scan mux 210 also has a single output that drives the DIN input of flipflop master latch 110.

During normal chip operation, when the chip is not operating in scan test mode, the scan enable input SE in FIG. 2 will be low. Thus, when the scan enable input SE is low, transmission gate X6 will be turned off and transmission gate X5 will be turned on, allowing the data input D to drive the DIN input of flipflop master latch 110. The data input D, in turn, is driven by an internal on-chip logic gate.

When the chip is operating in scan test mode, the scan enable input SE in FIG. 2 will be high. Thus, when SE is high, transmission gate X6 will be turned on and transmission gate X5 will be turned off, allowing the scan data input SD to drive the DIN input of flipflop master latch 110. In other words, when the chip is operating in scan test mode, the output of flip-flop 200 can be directly controlled (forced high or low) by simply driving the scan data input SD high or low.

FIGS. 3A-3B show representations of prior-art flipflops. FIG. 3A shows a circuit symbol that represents a prior-art CMOS D flipflop 310, and FIG. 3B shows a circuit symbol that represents a prior-art scan-enabled CMOS D flipflop 312. Referring to FIGS. 3A and 3B, flipflops 310 and 312 both contain an input pin D, an input pin CLK, an output pin Q, and an inverted output pin QZ. Furthermore, scan flipflop 312 also contains two additional scan input pins, SD and SE. As described above, scan input pins SD and SE are utilized to add scan test capability to flipflop 310.

In order to control and observe the large number of scan-enabled CMOS D flipflops on a chip, the scan flipflops must be serially connected together, to form one or more scan chains. This can be accomplished as shown in FIG. 4, which shows an example of a prior-art scan chain 400.

Referring to FIG. 4, scan chain 400 includes a number of scan-enabled CMOS D flipflops 410. Thus, as shown in FIG. 4, the SD inputs of all scan-enabled flipflops 410 are controlled by simply connecting the flipflops together to form a scan chain, which is simply a serial shift register.

Referring to FIG. 4, the Q output of a given flipflop 410 is connected to the scan data input SD of the next flipflop 410 in the serial scan chain. In addition, as shown in FIG. 4, all of the SE pins in a given flipflop chain must be connected together, and all of the CLK inputs in a given flip-flop chain must also be connected together.

Furthermore, in order for a chip to function correctly in its normal operating (non-scan) mode, the Q outputs of the flip-flops 410 must drive internal on-chip logic gates. Thus, as shown in FIG. 4, the arrows attached to the Q outputs of each flipflop 410 indicate that the Q outputs also drive one or more internal on-chip logic gates. (For simplicity, these logic gates are not shown in FIG. 4).

Referring to FIG. 4, the scan data input SD of the first flipflop 410 in scan chain 400 must be driven (directly or indirectly) from a primary chip input 412 (i.e., a chip input pin). This allows the state of each flipflop 410 to be controlled by simply shifting in the desired input data for each flip-flop 410. This input data is often referred to as a 'scan input vector'.

Furthermore, the Q output from the last flipflop 410 in scan chain 400 must also be connected (directly or indirectly) to a primary chip output 414 (i.e., a chip output pin). This allows the output of each flipflop 410 in scan chain 400 to be observed by simply shifting out the state of each flipflop in the scan chain. This output data is often referred to as a 'scan output vector'.

In order to test the internal logic gates within a chip, including all of the internal scan flipflops, input vectors must be shifted in, and the resulting output vectors must be shifted out. The output vectors are then compared with known good output vectors. If the two vectors match, the chip is said to be 'good'. If the two vectors do not match, the chip is said to be 'bad'. The input/output vector shifting, and the output vector comparison, are executed by a chip tester.

Before an input vector can be shifted into the chip, the scan enable inputs SE of flipflops 410 must be driven high, indicating that the chip is operating in scan test mode. As shown in FIG. 2, when the scan enable input SE is high, the DIN input data for master latch 110 comes from the scan data input SD of flipflop 200, not from the normal (non-scan) data input D.

Again referring to FIG. 4, after the scan enable input SE has been driven high, the flipflop clock signal CLK must then be pulsed until all bits of the scan input vector have been clocked into scan chain 400. As shown in FIG. 4, the bits are clocked in via the SD to Q path inside of each scan flipflop 410.

After the last bit of the scan input vector has been clocked into scan chain 400, the clock signal CLK is driven low. Furthermore, the scan enable input SE is also driven low, temporarily placing the chip in normal (non-scan) operating mode. At this point, the chip is ready to respond to the input test vector that has been serially shifted into the chip. The actual test begins when the tester issues a single clock pulse, which is often referred to as the 'launch clock'. The launch clock causes the previously loaded input vector to determine the next state (output vector) of all flipflops 410 in scan chain 400.

Thus, after the clock signal CLK has been driven high and then low, the scan enable input SE is then driven high, forcing the chip to re-enter scan test mode, and re-enabling the SD-to-Q scan path inside of each flipflop 410. Furthermore, after the scan enable input SE is driven high, the clock signal CLK must be pulsed until all bits of the output vector have been shifted out of the chip. While the bits of the output vector are being shifted out of the chip, the bits of a new input vector are being shifted into the chip.

The above shift-in/shift-out process continues until an output vector that has been shifted out fails to match its corresponding good output vector (which is stored inside the tester). In this case, the chip test fails, and the chip is bad. Otherwise, if all of the shifted out vectors match their corresponding good output vectors (which are stored inside the tester), the chip has passed all of its test vectors, and the chip is good.

The process of serially connecting a group of scan flipflops together to form a scan chain is referred to as 'scan stitching'. In other words, the scan stitching procedure consists of connecting the Q output of each flip-flop in a scan chain to the SD input of the next flipflop in the scan chain.

In a typical chip design flow, after logic synthesis has been completed, the flipflops are then stitched (connected) together into one or more scan chains, according to their position in the logic hierarchy. However, as described in greater detail below, this scan stitching is sub-optimal.

FIG. 5 shows a simplified example of a prior-art standard cell placement region 500. Referring to FIG. 5, standard cell placement region 500 contains eleven scan flipflops 510 that have been physically placed by a router. (For simplicity, the standard cell logic gates are not shown in FIG. 5).

Referring to FIG. 5, the scan flipflops 510 have been placed into standard cell rows, which have a uniform height. Furthermore, the standard cell rows can be touching each other, or they can be non-uniformly spaced apart.

FIG. 6 shows a simplified example of a prior-art standard cell placement region 600. Standard cell placement region 600 is similar to standard cell placement region 500 and, as a result, utilizes the same reference numerals to designate the structures which are common to both placement regions. As shown in FIG. 6, placement region 600 differs from placement region 500 in that the scan flipflops 510 in placement region 600 have been stitched together to form a scan chain 610.

In the FIG. 6 example, scan chain 610, which is created from the standard cell logic hierarchy before a router has determined the physical placement of the scan flipflops, is:

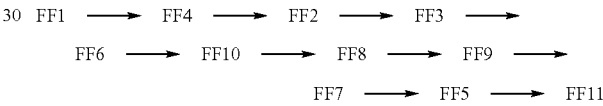

As shown in FIG. 6, the scan chain wires must necessarily snake back and forth horizontally and vertically, in the plane of the figure, in order to connect the scan flipflops together, as specified by the above scan chain. As a result of this wire routing, the scan chain wires can become long and congested. Furthermore, for simplicity, FIG. 6 does not show the common net that connects all of the scan enable inputs SE together. As described above, this common SE net must be routed (connected) to all of the scan flipflops, causing even more wire congestion than that shown in FIG. 6.

The scan stitching shown in FIG. 6 is highly undesirable for a number of reasons. Firstly, it forces the scan chain wires to make unnecessary (and often substantial) traverses in the horizontal and vertical directions. Furthermore, these unnecessary wire traverses are bad because they can substantially increase the lengths and congestion of the scan chain wires, unnecessarily increasing the capacitance on the scan flip-flop outputs. Moreover, because the wire capacitance on the scan flip-flop outputs is increased, the chip power dissipation will also be increased (in both scan mode and normal operating mode). In addition, the capacitance increase on the scan flipflop outputs can also decrease the chip operating speed.

Furthermore, the unnecessary scan wire traverses also force the router to make unnecessary metal layer changes, when routing a given scan chain. Moreover, these unnecessary metal layer changes often generate pieces of scan chain wire on several different metal layers. As a consequence of this, these pieces of scan chain wire can easily block the routing of non-scan nets, in those regions where the pieces of scan chain wire exist. In other words, the wire congestion in these regions will be increased, which can easily cause the chip size to increase.

Thus, there is a need for a routing method that, when connecting the Q-to-SD scan chain nets, and the common SE net, avoids unnecessary wire crossovers, unnecessary wire layer to wire layer changes, and unnecessary blocking of nets on several of the metal layers (i.e. 'wrong way' routing).

In summary, although the prior-art scan chain routing methodology functions adequately from a netlist standpoint, there is need for a method of specifying scan chain stitching that reduces the lengths of the scan chain wires, thereby reducing chip wiring congestion, chip size, flipflop load capacitance, flipflop propagation delay and flipflop power dissipation.

BRIEF DESCRIPTION OF THE DRAWINGS

FIGS. 3A-3B are representations of prior-art flipflops. FIG. 3A illustrates a circuit symbol that represents a prior-art CMOS D flipflop 310. FIG. 3B illustrates a circuit symbol that represents a prior-art scan-enabled CMOS D flipflop 312.

FIG. 4 is a circuit schematic illustrating an example of a prior-art scan chain 400.

DETAILED DESCRIPTION OF THE INVENTION

Figure 7:
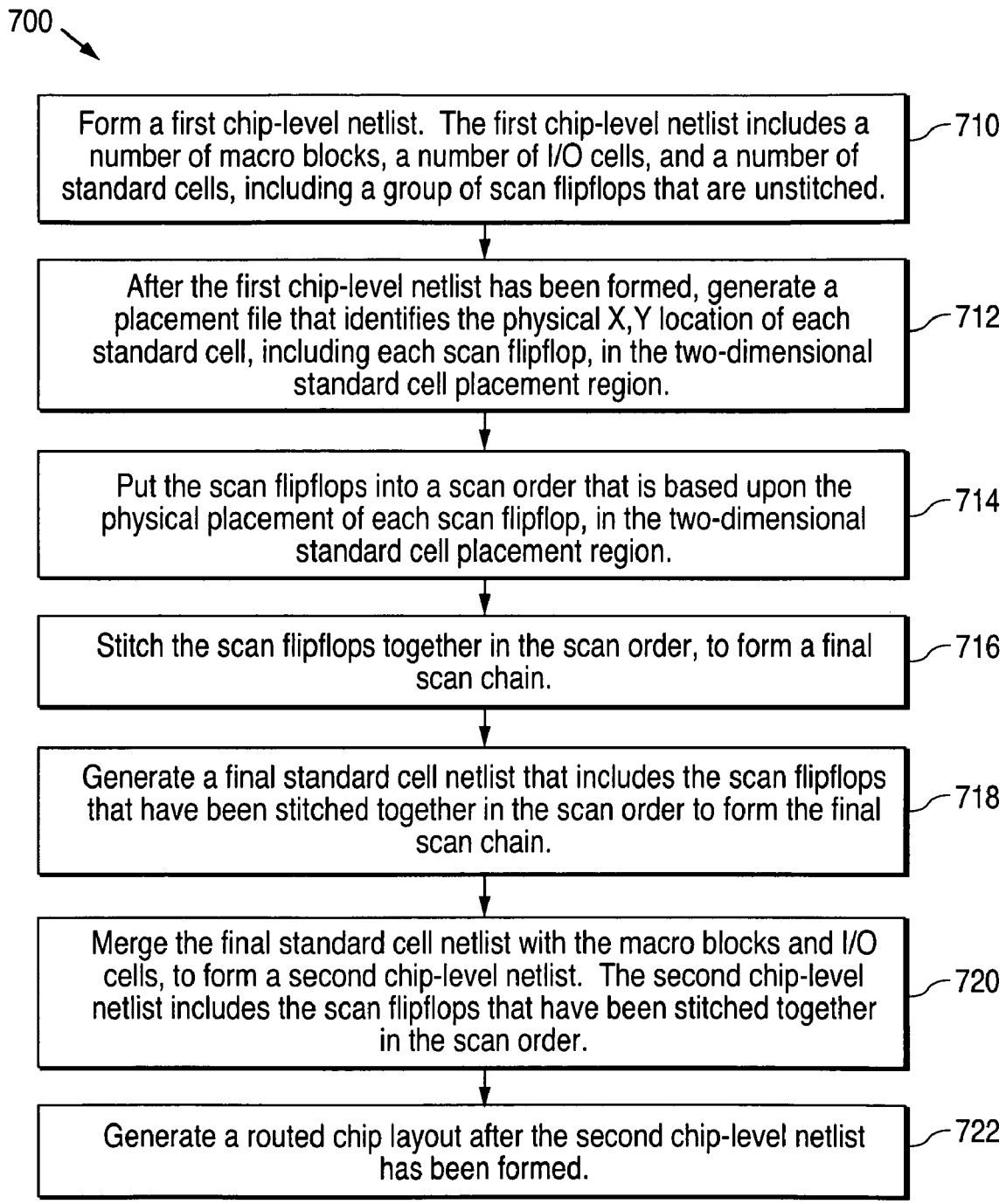
FIG. 7 is a flow chart illustrating an example of a method 700 of stitching scan flipflops together, in accordance with the present invention.

In accordance with the present invention, FIG. 7 shows a flow chart that illustrates an example of a method 700 of stitching scan flip-flops together. As described in greater detail below, the method of the present invention substantially improves the scan stitching order for the scan flipflops in a scan chain.

Before discussing method 700, the following terms are first defined. A netlist is a file that contains interconnect information for standard cells, and/or macro blocks, and/or I/O cells. A Verilog netlist is a netlist that is in Verilog format. A chip-level or top-level netlist is a netlist for an entire chip. The netlist can contain standard cells, macro blocks and I/O cells. An unstitched netlist is a netlist that contains scan flipflops whose SD and SE pins are not connected. A stitched netlist is a netlist that contains scan flipflops whose SD and SE pins are connected.

A D flipflop is a flipflop that does not contain SD and SE scan pins. A scan flipflop is a D flipflop that contains SD and SE scan pins. Scan stitching is the process of specifying the interconnect order for the Q-to-SD pins, and the SE pins, in scan flipflop chains. Scan test software is a software program that is capable of performing scan stitching. A UNIX sed script is a program that is used to unstitch (disconnect) scan chains that have been previously stitched (connected).

A macro block is a logic block, such as a RAM or ROM, that does not contain standard cells. I/O cells are input/output cells that are located around the periphery of a chip. A clock placement region is an area of a chip that contains standard cells that are driven by the same clock signal. Logic hierarchy is the block nesting order for a chip, including standard cell blocks, macro blocks and I/O cell blocks.

A standard cell logic hierarchy is the block nesting order for standard cell blocks only. A logic synthesis program is a software program that reads a high level language (HLL) description of a chip (such as a Verilog or VHDL description), and implements the HLL description using standard cells. A Verilog-in command is a router command that reads-in a Verilog netlist, and then creates an autoLayout rep. An auto-Layout rep is a router file that contains skeletal (outline) physical descriptions of standard cells, macro blocks and I/O blocks. An autoLayout rep also includes interconnect information for the standard cells, macro blocks and I/O blocks.

A scan chain is a group of scan flipflops that utilize a common clock signal, and whose Q-to-SD pins are connected to form a shift register. A scan stitching pre-processor program is a software program that creates an optimally ordered list for interconnecting the Q-to-SD pins (and the SE pins) in a scan chain. (The actual scan stitching is performed by the scan test software program).

A place and route program is a software program that can physically place standard cells, macro blocks and I/O cells, and create wires to physically interconnect them. A router is an alternate name for a place and route program. A placement file is a file that specifies the physical locations of standard cells, and/or macro blocks, and/or I/O cells. Global routing is a procedure for specifying the sequence (or channel order) in which nets (wires) will be physically routed. Detail routing is a procedure for physically routing nets that have already been globally routed.

Referring to FIG. 7, method 700 of the present invention begins at 710, by forming a first chip-level netlist. The first chip-level netlist, which can be in a Verilog format, includes synthesized standard cells, macro blocks, and I/O cells. The synthesized standard cells, in turn, include a group of scan flipflops that are unstitched, i.e., the scan flipflop SD and SE pins are not connected as part of a scan chain. (However, the flipflops are connected to other logical blocks via their clock pins, D pins, and Q/QZ pins).

In the present example, the group of scan flipflops is associated with a single standard cell placement region. However, the first chip-level netlist can include multiple groups of scan flipflops that are associated with one standard cell placement region, or with multiple standard cell placement regions.

Figure 8:
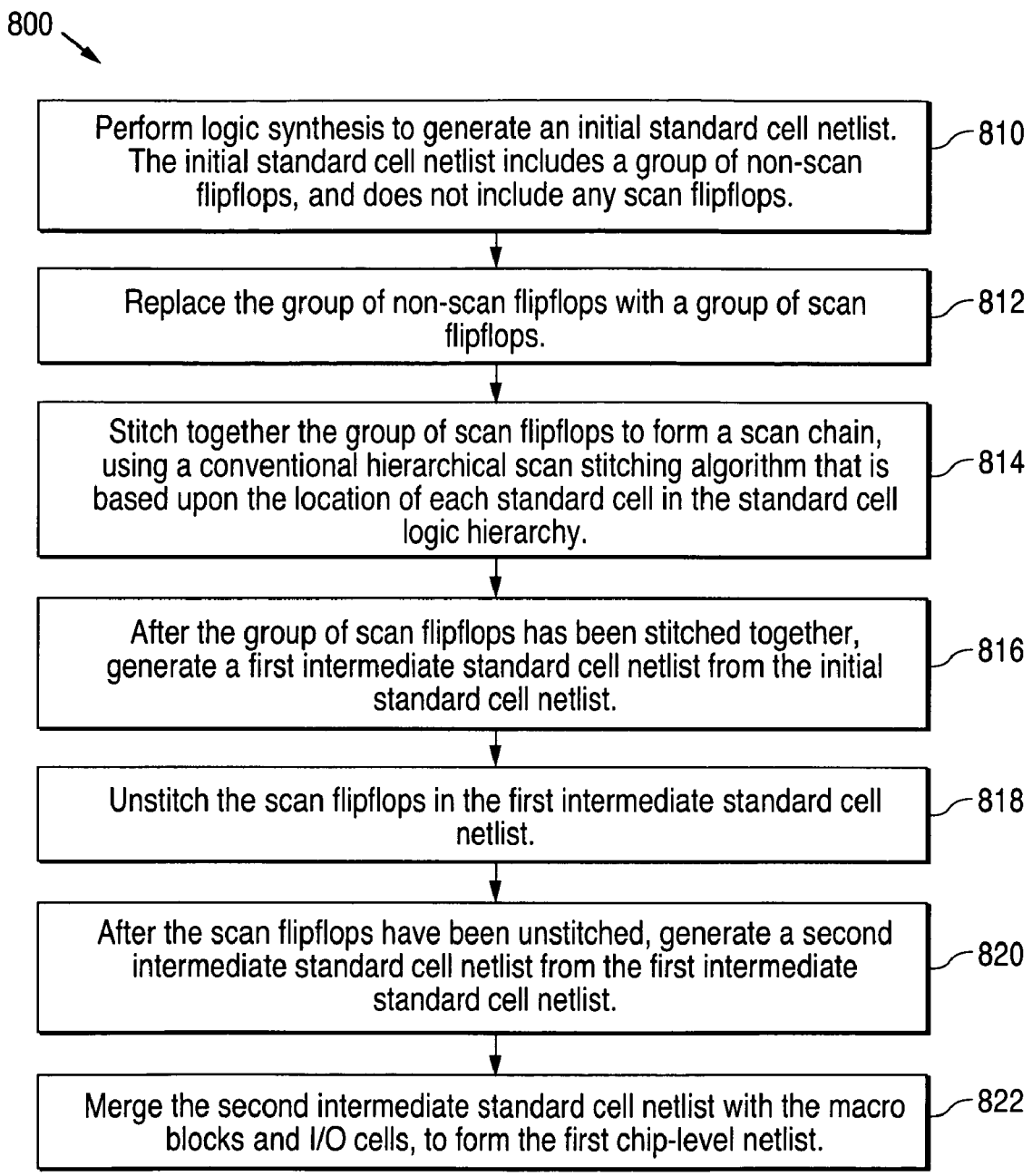
FIG. 8 is a flow chart illustrating an example of a method 800 of forming a first chip-level netlist, in accordance with the present invention.

In accordance with the present invention, FIG. 8 shows a flow chart that illustrates an example of a method 800, that forms a first chip-level netlist. Referring to FIG. 8, method 800 begins at 810, by performing logic synthesis to generate an initial standard cell netlist. The initial standard cell netlist, which is produced at the end of gate-level logic synthesis, includes a group of D flipflops, but no scan flip-flops.

Furthermore, the initial standard cell netlist, which can be generated in Verilog format, includes only synthesized standard cells—i.e. it does not contain macro blocks or I/O cells. Moreover, since the initial standard cell netlist contains no macro blocks or I/O cells, the initial standard cell netlist is not a chip-level netlist.

Continuing on to 812, method 800 replaces the group of D flip-flops with a group of scan flipflops. Next, at 814, method 800 stitches together the group of scan flipflops, using conventional hierarchical scan stitching, to form a scan chain. (At this point, the scan stitching is based upon the scan flipflop locations in the standard cell logic hierarchy, not upon the physical placement of the scan flipflops). Next, method 800 moves to 816, to generate a first intermediate standard cell netlist, which can be in Verilog format, from the initial standard cell netlist, after the group of scan flip-flops has been stitched together to form a scan chain.

Following this, at 818, method 800 unstitches the scan flipflops in the first intermediate standard cell netlist. For example, a Unix 'sed' script can be used to unstitch the scan flipflops. (Elements 810, 812, 814, and 816 are conventional elements which, as a result, requires that the scan flipflops in the first intermediate standard cell netlist be unstitched. Alternately, method 800 can move from element 812 directly to element 820.)

Next, method 800 moves to 820, to generate a second intermediate standard cell netlist from the first intermediate standard cell netlist, after the group of scan flipflops has been unstitched. Following this, method 800 moves to 822, to merge the second intermediate standard cell netlist with a number of macro blocks and I/O cells, to form the first chip-level netlist.

As described above, the first chip-level netlist includes a group of scan flipflops, but they are not stitched together to form a scan chain. In other words, the first chip-level netlist includes all of the scan flipflops that are in the first intermediate standard cell netlist, but the scan data inputs SD, and the scan enable inputs SE, are unconnected. Therefore, this unstitching allows the router to completely ignore all scan stitching during the standard cell placement procedure. This allows the router to place each scan flipflop in its most optimal location (as determined by the router), based upon the required connections to its D, CLK, Q and/or QZ pins.

Referring again to FIG. 7, after the first chip-level netlist has been formed, method 700 moves to 712, to generate a placement file that identifies the physical X,Y location of each standard cell, including each scan flipflop in the two-dimensional standard cell placement region.

Figure 9:
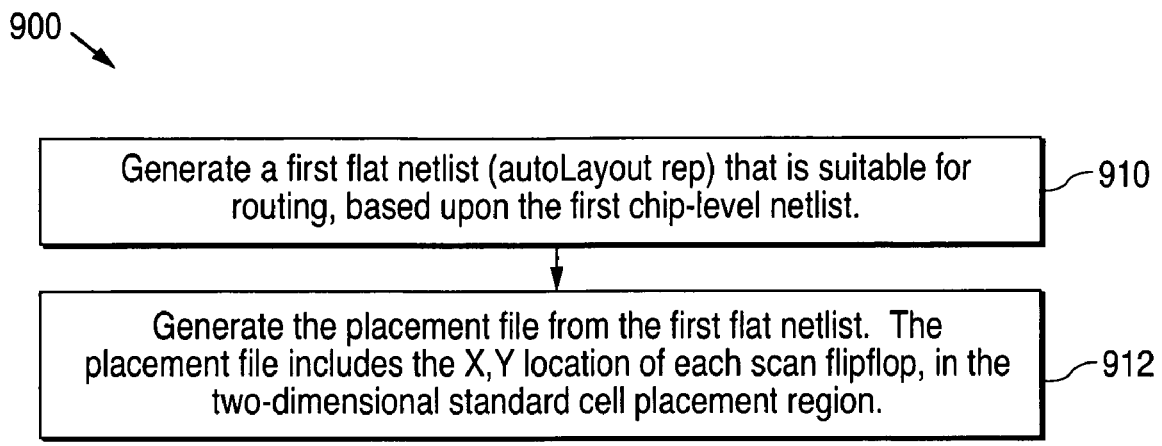
FIG. 9 is a flow chart illustrating an example of a method 900 of determining the physical placement for each scan flipflop, in a two-dimensional standard cell placement region, in accordance with the present invention.

In accordance with the present invention, FIG. 9 shows a flow chart that illustrates an example of a method 900 that generates the placement file. Referring to FIG. 9, method 900 begins at 910, by generating a first flat netlist (autoLayout rep) that is suitable for routing, based upon the first chip-level netlist. For example, a Verilog-in command can be performed, which reads in a Verilog chip-level netlist, and creates a first flat netlist (autoLayout rep).

After the first flat netlist has been formed, method 900 moves to 912, to generate the placement file from the first flat netlist. The placement file, which includes all of the standard cells, has one line for each scan flipflop (ignoring line continuation characters). Furthermore, each line includes the scan flipflop instance name, and the X,Y location of each scan flipflop, in the two-dimensional standard cell placement region.

Again referring to FIG. 7, after the placement file has been generated, which identifies the physical X,Y location of each scan flip-flop, method 700 moves to 714, to place the scan flipflops into a scan order that is based upon their physical X,Y location in the two-dimensional standard cell placement region.

Figure 10:
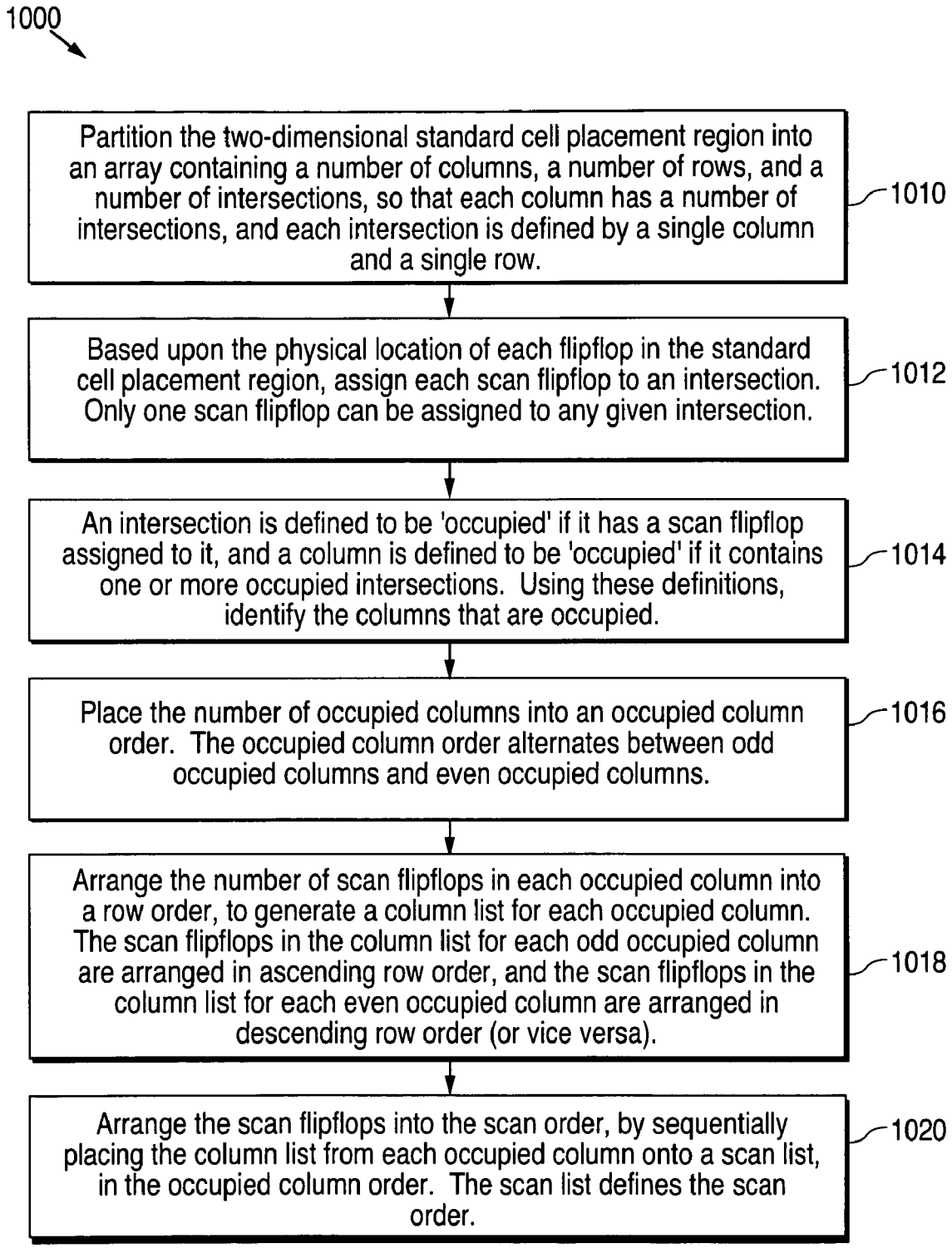
FIG. 10 is a flow chart illustrating an example of a method 1000 of placing scan flipflops into a group, in a scan order that is based upon the physical placement of the scan flipflops in a two-dimensional standard cell placement region, in accordance with the present invention.

In accordance with the present invention, FIG. 10 shows a flow chart that illustrates an example of a method 1000, for placing scan flipflops into a scan order that is based upon their physical X,Y location in a two-dimensional standard cell placement region. As shown in FIG. 10, method 1000 begins at 1010, by partitioning the two-dimensional standard cell placement region into an array containing a number of columns, a number of rows, and a number of intersections, so that each column contains a number of intersections, and each intersection is defined by a single column and a single row.

Figure 11:
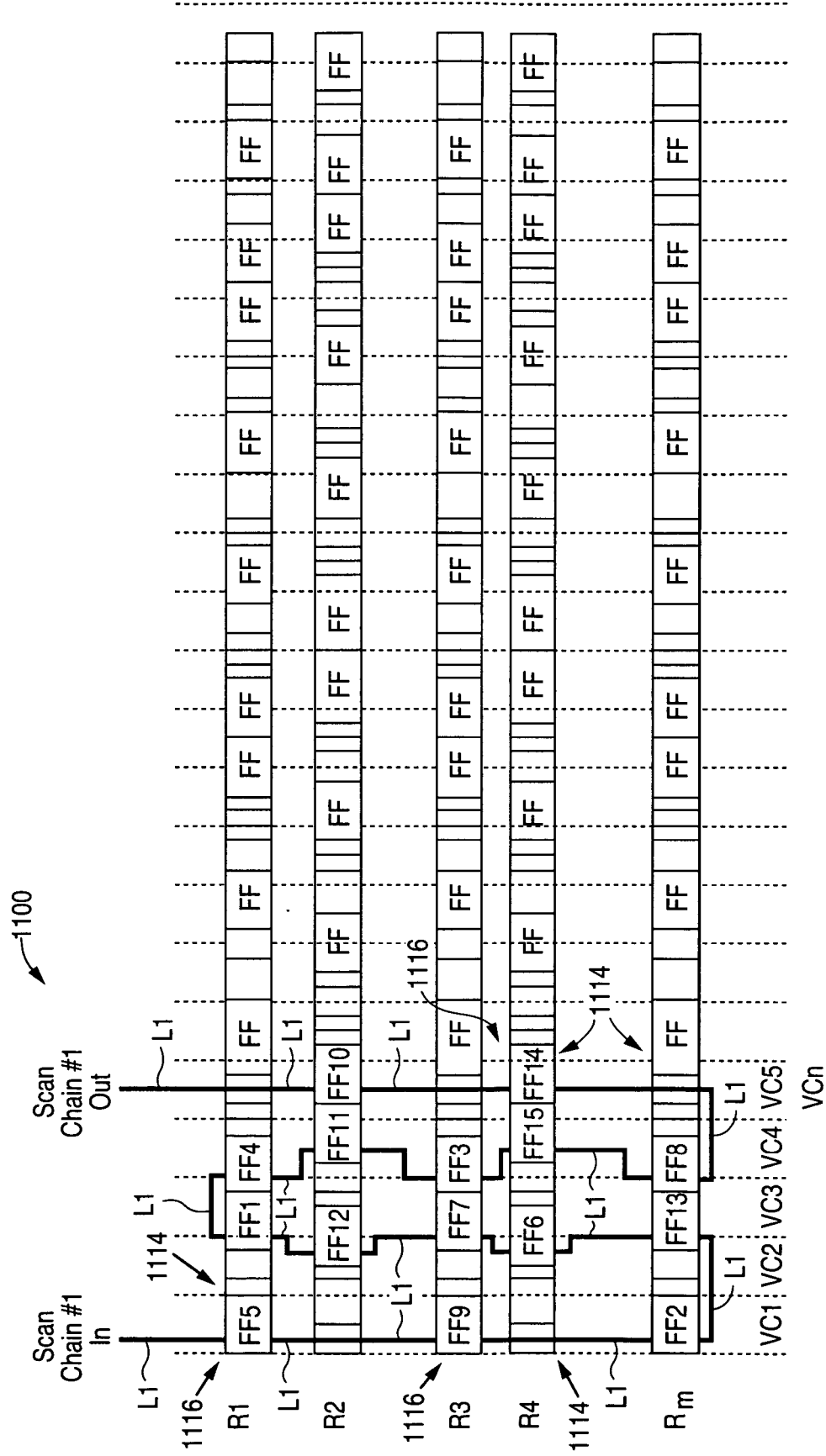
FIG. 11 is an example of a two-dimensional standard cell placement region 1100, representing a portion of a semiconductor chip, in accordance with the present invention.

In accordance with the present invention, FIG. 11 shows a two-dimensional standard cell placement region 1100, that represents a portion of a chip. As shown in FIG. 11, a group of scan flipflops FF1-FF15, and a number of other standard cells that are not scan flipflops, have been placed into the two-dimensional standard cell placement region 1100. As shown in FIG. 11, all of the standard cells have a uniform height. Furthermore, the widths of the standard cells, including the scan flipflops, are non-uniform.

As further shown in FIG. 11, the two-dimensional standard cell placement region 1100 has been partitioned into an array that has a number of columns VC1-VCn, a number of rows R1-Rm, and a number of intersections 1114, so that each column VC has a number of intersections 1114, and each intersection 1114 is defined by a single column VC and a single row R. (Although the standard cell rows R1-Rm in FIG. 11 would normally abut each other, the rows R1-Rm have been deliberately separated, in order to emphasize the scan chain stitching.)

The vertical columns VC shown in FIG. 11 can be assigned, for example, starting on the left edge of the standard cell placement region, or starting on the right edge of the standard cell placement region. (The vertical columns shown in FIG. 11 have been assigned starting from the left edge of the standard cell placement region). The vertical columns have a uniform width, which is equal to the width of a scan flipflop. (In those cases where the scan flipflops have varying widths, the vertical column width can be made equal to the width of the widest scan flip-flop).

Again referring to FIG. 10, after the two-dimensional standard cell placement region has been partitioned into an array, method 1000 moves to 1012, where each scan flipflop is assigned to an intersection, based upon the physical location of the scan flipflop in the two-dimensional standard cell placement region. Only one scan flipflop can be assigned to any given intersection.

In the FIG. 11 example, scan flipflops FF5, FF9 and FF2 have been assigned to intersections 1114 in column VC1; scan flipflops FF1, FF12, FF7, FF6 and FF13 have been assigned to intersections 1114 in column VC2; no scan flipflops have been assigned to intersections 1114 in column VC3; scan flipflops FF4, FF11, FF3, FF15 and FF8 have been assigned to intersections 1114 in column VC4; and scan flipflops FF10 and FF14 have been assigned to intersections 1114 in column VC5.

Again referring to FIG. 10, after the scan flipflops have been assigned to an intersection, method 1000 moves to 1014, to identify the number of columns that are occupied. In the FIG. 11 example, the occupied columns are columns VC1, VC2, VC4 and VC5. Furthermore, column VC3 is not occupied. In addition, each occupied column contains a number of intersections 1114, and a number of scan flipflops FF. The number of intersections 1114 in an occupied column includes a number of assigned intersections 1116 that corresponds with the number of scan flipflops FF in the occupied column.

Returning to FIG. 10, after the occupied columns have been identified, method 1000 moves to 1016, to place the number of occupied columns into an occupied column order. Furthermore, the occupied column order alternates between odd and even occupied columns. Thus, in the FIG. 11 example, the occupied column order is VC1, VC2, VC4, and VC5. In addition, the occupied column order includes odd occupied columns VC1 and VC4, and even occupied columns VC2 and VC5.

Referring to FIG. 10, after the occupied column order has been determined, method 1000 moves to 1018, to arrange the scan flipflops in each occupied column into a row order, to generate a column list for each occupied column. Thus the column list for a given occupied column organizes the scan flipflops into the proper scan order for that occupied column.

In the present example, the scan flipflops in the column list of each odd occupied column are arranged in ascending row order. In addition, the scan flipflops in the column list of each even occupied column are arranged in descending row order. (Alternately, it is also possible to arrange the scan flipflops in odd occupied columns into descending row order, and to arrange the scan flipflops in even occupied columns into ascending row order).

In the FIG. 11 example, the column list for the first occupied column VC1, which is arranged in ascending row order, is scan flipflops FF5, FF9 and FF2. The column list for the second occupied column VC2, which is arranged in descending row order, is scan flipflops FF13, FF6, FF7, FF12 and FF1. Furthermore, the column list for the third occupied column VC4, which is arranged in ascending row order, is scan flipflops FF4, FF11, FF3, FF15 and FF8. Moreover, the column list for the fourth occupied column VC5, which is arranged in descending row order, is scan flipflops FF14 and FF10.

Again referring to FIG. 10, after the scan flipflops in each occupied column have been arranged into a row order, method 1000 moves to 1020, to arrange the scan flipflops into the scan order. This is accomplished by sequentially placing the column list, from each occupied column, onto a scan list, in the occupied column order. The scan list, in turn, defines the scan order. In the FIG. 11 example, the scan list is [FF5, FF9, FF2], [FF13, FF6, FF7, FF12, FF1], [FF4, FF11, FF3, FF15, FF8], [FF14 and FF10], which represents the column lists of the scan flipflops, in occupied column order.

Referring again to FIG. 7, after the scan flipflops in a scan group have been placed into the scan order, method 700 moves to 716, to stitch the scan flipflops in the group together in the scan order, to form a final scan chain. Based upon the final scan chain, which is actually an ordered scan list, the actual scan stitching is then performed by adding the appropriate SD-to-Q scan chain wires to the standard cell netlist.

If desired, the flipflop routing order for the common SE net can be specified using method 1000. However, in some cases, better results can be obtained by routing the SE net horizontally (on the metal3 layer, for example). Furthermore, from a power dissipation standpoint, the routing order for the SE net is not critical because this net does not change state during normal chip operation, and it does not change state very often during scan testing.

After the scan flipflops in a scan group have been stitched together in the scan order, method 700 moves to 718, to generate a final standard cell netlist that includes the scan flipflops that have been stitched together. The final chip-level netlist can be in Verilog format.

Following this, method 700 moves to 720, to merge the final standard cell netlist with the macro blocks and I/O cells to form a second (final) chip-level netlist. The second (final) chip-level netlist includes the group of scan flipflops that have been stitched together in scan order. After this, method 700 moves to 722, to generate a routed chip layout.

Figure 12:
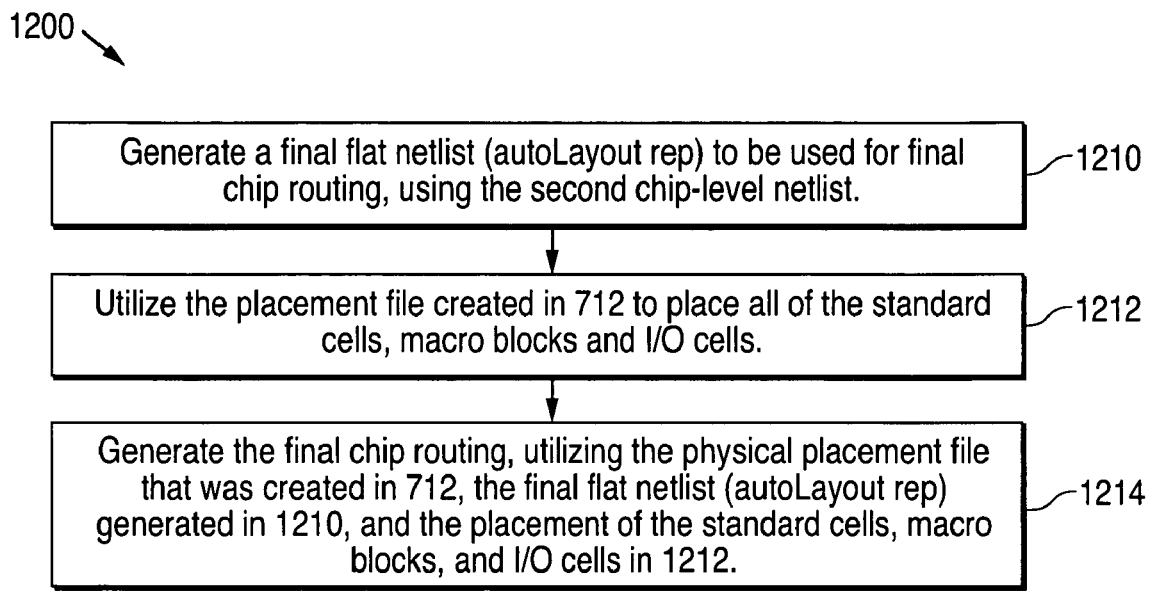
FIG. 12 is a flow chart illustrating an example of a method 1200 of generating a routing layout, in accordance with the present invention.

In accordance with the present invention, FIG. 12 shows a flow chart that illustrates an example of a method 1200, to generate a routed chip layout. As shown in FIG. 12, method 1200 begins at 1210, to generate a final flat netlist (autoLayout rep), that is suitable for routing, based upon the second (final) chip-level netlist. For example, as noted above, a Verilog-in command can be performed, in order to read-in the second Verilog chip-level netlist, after which a flat autoLayout rep (netlist) is then created.

Thus, after the final flat autoLayout netlist has been created, method 1200 moves to 1212, to utilize the physical placement file that was created in 712 to place all of the standard cells, macro blocks, and I/O cells. Following this, method 1200 moves to 1214 to generate the routed chip layout, utilizing the physical placement file that was created in 712, the final flat netlist (autoLayout rep) generated in 1210, and the placement of the standard cells, macro blocks, and I/O cells in 1212.

The routed chip layout is generated by a router, which can perform global routing and detail routing, in order to interconnect all of the standard cells, macro blocks and I/O cells. At this point in the design flow, the required scan flipflop interconnections include the scan wires that must be connected according to the scan order specified in the second (final) chip-level netlist. As shown in the FIG. 11 example, the lines L1 represent the scan chain wires for scan chain #1.

In summary, and in accordance with the present invention, a method has been described that employs a scan stitching methodology that stitches the scan chain, after a router has physically placed the unstitched scan flipflops. Method 700 can provide an optimal stitch because it stitches each scan flipflop based upon its physical location, not upon its position in the standard cell logic hierarchy. This essentially results in little or no increase in routing area, due to the scan chain wire connections, in all of the scan chains.

Furthermore, the scan chains are stitched together after the router has been allowed to optimally place the scan flipflops (as determined by the router), ignoring the scan stitching. In other words, the router has been allowed to optimally place the scan flipflops, based upon their normal (non-scan) interconnections, not upon how the scan chains have been (or will be) stitched.

Figure 1:
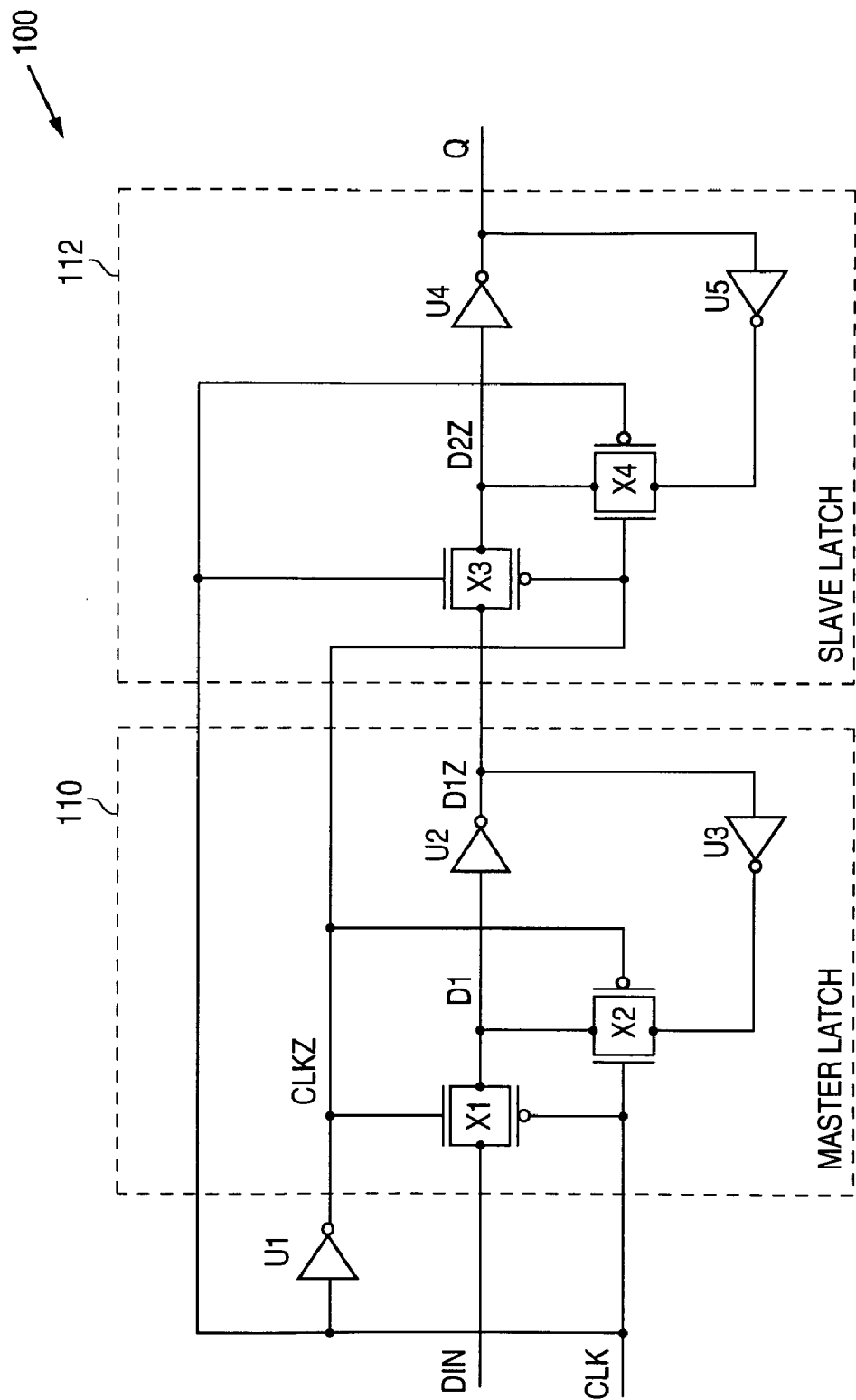
FIG. 1 is circuit schematic illustrating an example of a prior-art rising-edge-triggered CMOS D flipflop 100.
Figure 2:
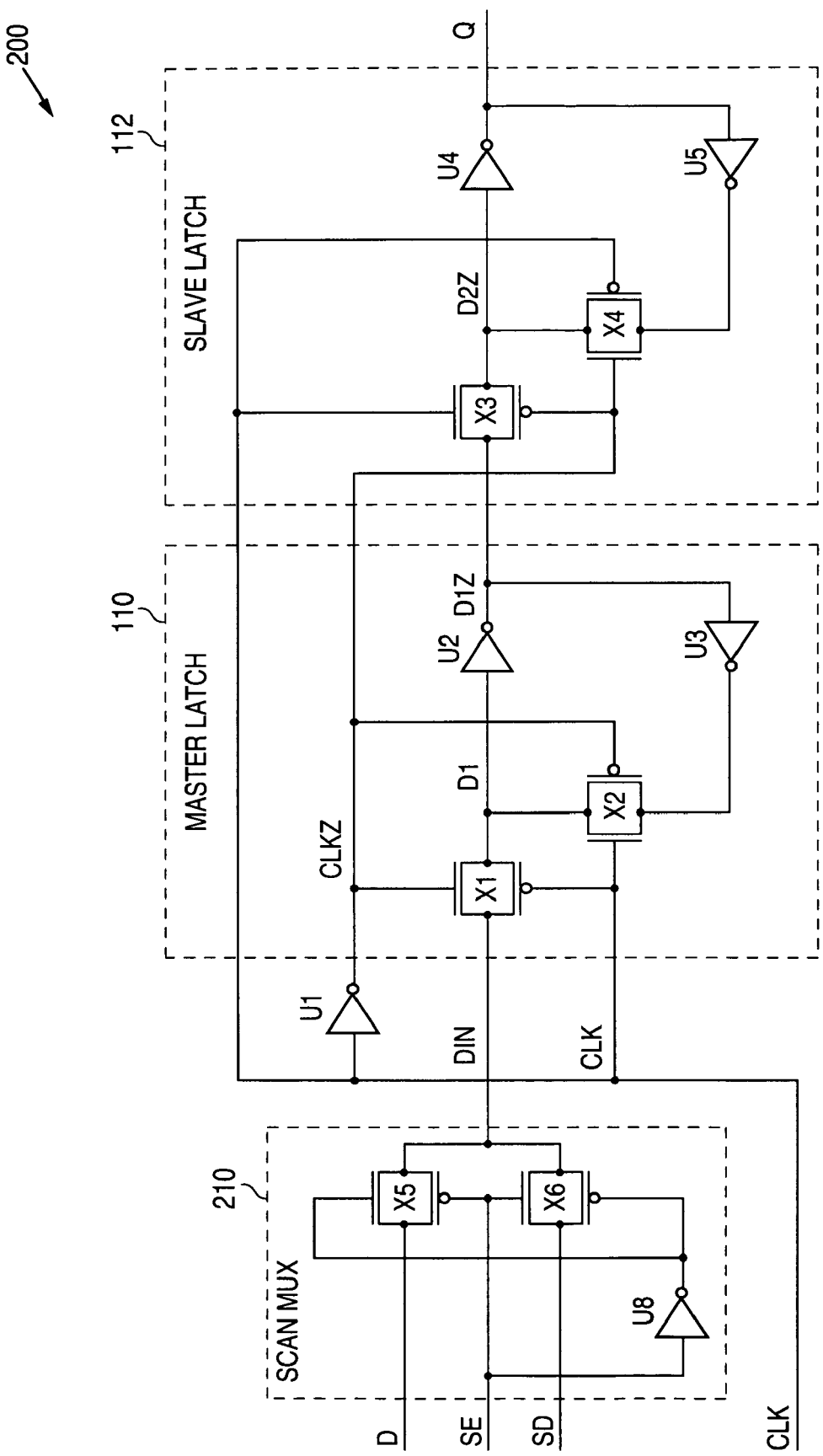
FIG. 2 is circuit schematic illustrating an example of a prior-art scan-enabled rising-edge-triggered CMOS D flipflop 200.
Figure 5:
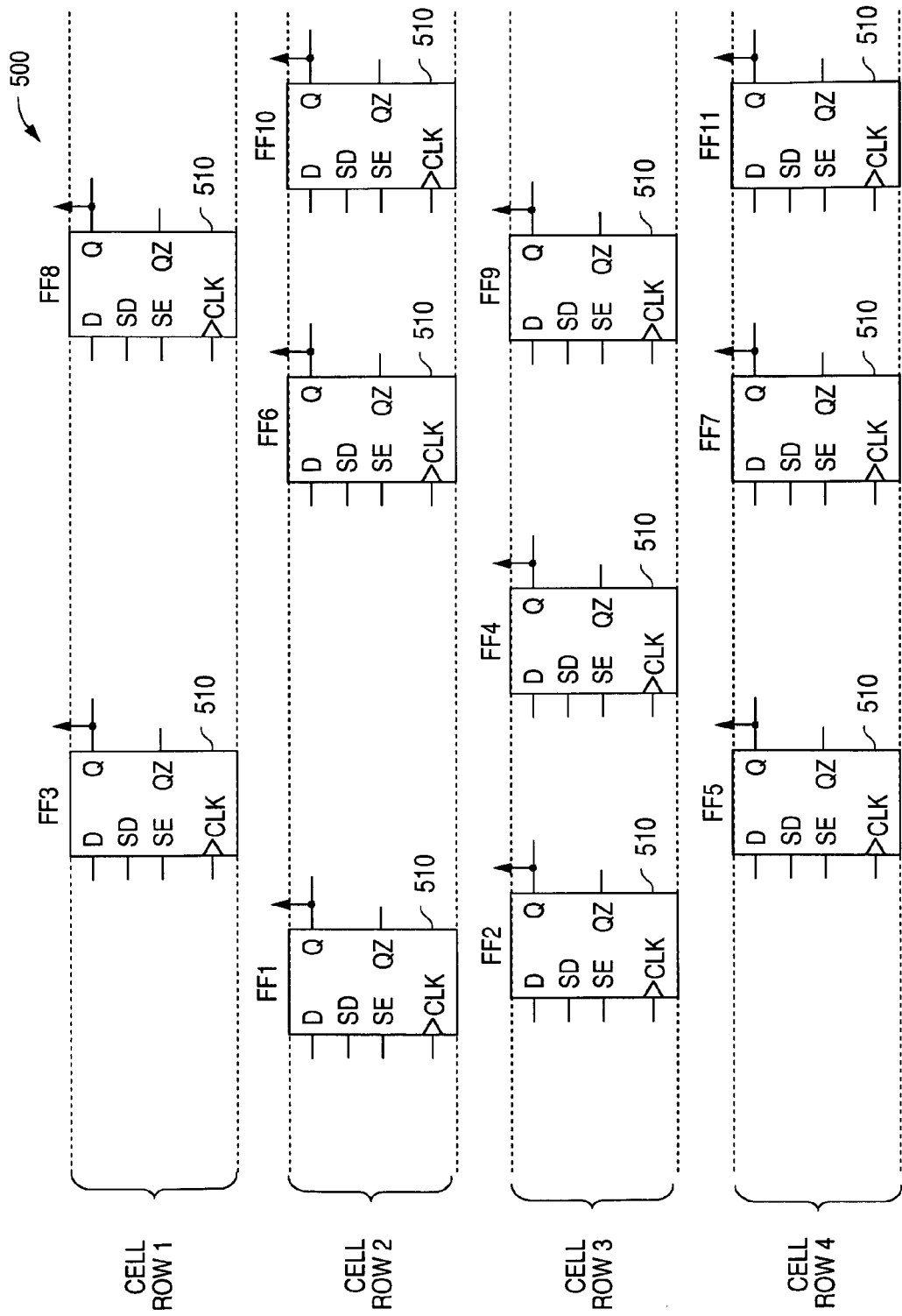
FIG. 5 is a simplified example of a prior-art standard cell placement region 500.
Figure 6:
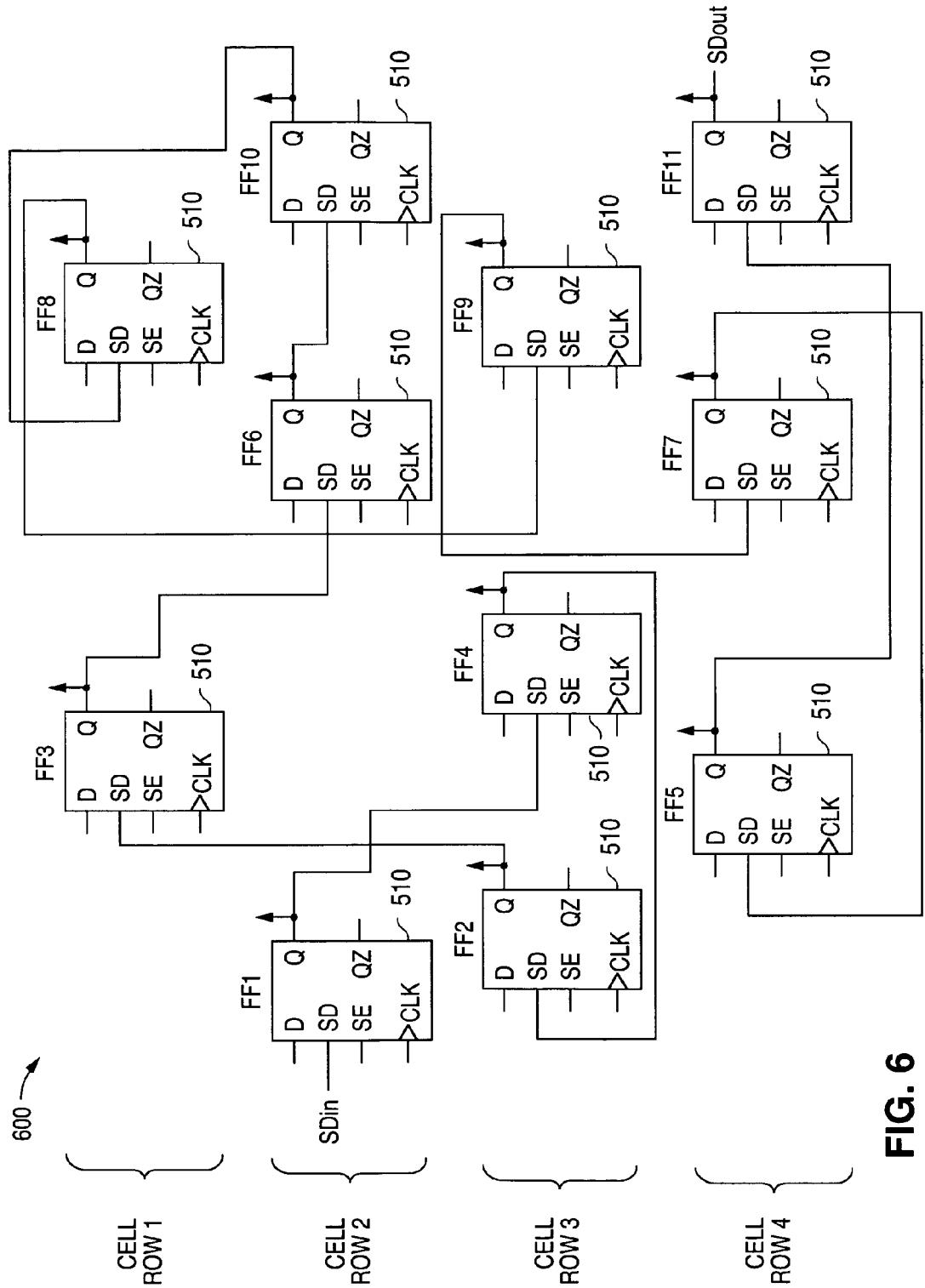
FIG. 6 is a simplified example of a prior-art standard cell placement region 600.

Moreover, an important advantage of the present invention is that it minimizes the total length of the Q-to-SD wires in a scan chain. For example, the scan chain routing shown in FIG. 11 dramatically reduces the length of the scan chain wires (L1 wires), in comparison to the routing shown in FIG. 6. This wire length decrease, in turn, results in decreased wire congestion. As a result, the scan chain wires of the present invention will not cause an unnecessary increase in wire congestion, and thus they will not cause an unnecessary increase in chip area.

Furthermore, the reduction in scan chain wire length reduces wire capacitance and power dissipation. In other words, the total wire capacitance on the Q outputs of the scan flipflops is reduced, due to the shorter lengths of the scan chain wires. This lower total capacitance minimizes the chip $CV^2F$ power dissipation during normal chip operation, and it also minimizes the chip $CV^2F$ power dissipation during scan testing. Moreover, the propagation delays, from the scan flip-flop outputs to the standard cell inputs, are also reduced.

Minimizing the $CV^2F$ power dissipation during scan path operation is critically important for many chips. The reason for this is that the power dissipated by a chip can significantly increase in scan mode, in comparison to the power that is normally dissipated during normal chip operation. This increased power dissipation is mainly due to the increased switching activity that normally occurs during scan path shifting operations.

Furthermore, the increased power dissipation that occurs during scan testing raises the chip temperature, causing the chip to run slower, which can cause one or more chip speed failures. This is especially true for high performance chips that must operate at high speed, during normal chip operation.

Another advantage of the present invention is that most of the scan chain routing can be done on a single metal layer, in the preferred metal direction. This type of routing tends to minimize wire congestion and chip size. For example, as shown in the FIG. 11, the scan chain routing for scan chain #1 is mostly done in the vertical direction (which can be metal-2, for example).

Since standard cells are considerably less complex than macro blocks, standard cells generally utilize only the first metal layer (metal-1) for intra-cell interconnect. To a limited extent, standard cells can also utilize the polysilicon layer and the P+/N+ diffusion layers for interconnection.

Furthermore, since the metal-1 layer is utilized extensively inside of the standard cells, the metal-1 interconnect does not have a preferred direction. In other words, inside of the standard cells, the metal-1 interconnect can be routed both horizontally and vertically, without incurring an area penalty.

Nevertheless, all of the upper level metal layers on a chip (metal-2 and above) do have a preferred metal direction. Furthermore, the metal-2 layer, and all of the metal layers above it, almost always alternate their preferred direction. For example, if metal-2 runs vertically, metal-3 will run horizontally, metal-4 will run vertically, and so on.

As a routing example, the vertical sections of scan chain #1 can be routed on the metal-2 layer, using the preferred (vertical) direction for metal-2. Moreover, the small horizontal pieces of scan chain #1 can also be routed on the metal-2 layer, so that substantially all of scan chain #1 is routed on the metal-2 layer. In this case, the small pieces of metal-2 that run in the horizontal direction form "wrong way routing". Since wrong way routing goes perpendicular to the preferred (vertical) direction for metal-2, wrong way routing of the scan nets can block the routing of non-scan nets, whose metal-2 is running in the preferred metal-2 direction. However, if the scan metal pieces that form wrong way routing are short in length, they may not substantially block the routing of non-scan nets, especially in those standard cell regions where the wire density is not extremely high. Nevertheless, when routing the scan chains, wrong way routing can be completely avoided by simply utilizing another metal layer (metal-3, for example), so that all of scan chain #1 can be formed in the preferred directions for metal-2 and metal-3.

As described above, a further advantage of the present invention is that the flipflop scan chains are not assigned prior to the physical placement of the scan flipflops. As a result, the physical placement of the scan flipflops can be optimized (as determined by the router), based upon the flipflop net connectivity required, ignoring the scan nets. In other words, scan flipflop placement is no longer adversely influenced by pre-existing, non-optimal Q-to-SD scan chain connectivity, or by pre-existing connectivity of the common SE net. As a result, the lengths of the non-scan flipflop nets can be minimized, resulting in decreased flipflop output capacitance, decreased flipflop propagation delay, and decreased flip-flop power dissipation.

In addition, the present invention also avoids unnecessary wire crossovers, unnecessary wire-layer-to-wire-layer changes, and unnecessary blocking of nets on several of the metal layers (due to wrong way routing of long scan nets).

Figure 13:
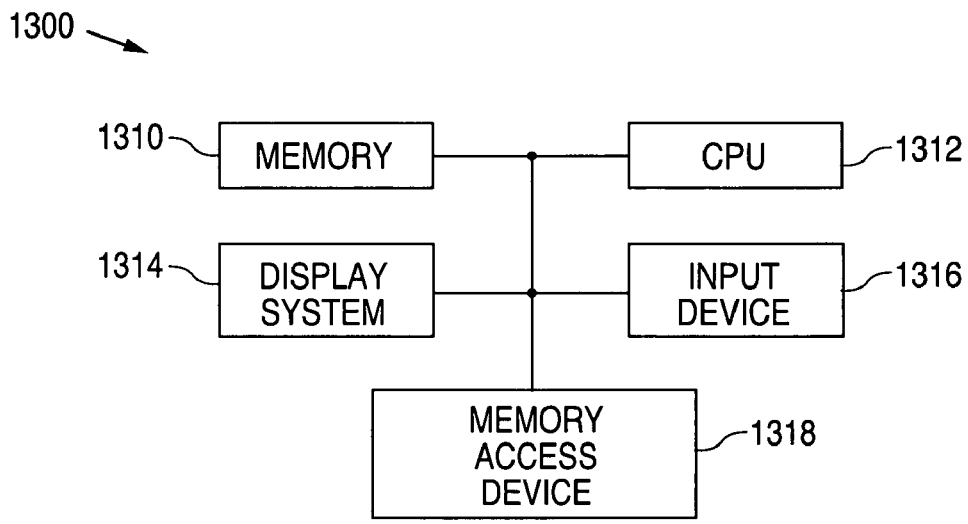
FIG. 13 is a block diagram illustrating an example of a computer 1300, in accordance with the present invention.

In accordance with the present invention, FIG. 13 shows a block diagram that illustrates an example of a computer 1300. As shown in FIG. 13, computer 1300 includes a memory 1310, and a central processing unit (CPU) 1312 that is connected to memory 1310. Memory 1310 can store data, an operating system, and a set of programming instructions. Furthermore, the operating system can be implemented with, for example, the Unix or Linux operating system, although other operating systems can be alternatively used. The programming instructions, which are used to execute all or part of the methods of the present invention, can be written in C or C++, for example, although other programming languages can be alternatively used.

CPU 1312, which can be implemented with, for example, a Core™ 2 Quad processor manufactured by Intel® or a similar processor, can operate upon programming instructions that implement all or part of the methods of the present invention. Furthermore, although only one processor has been described, the present invention can be implemented by utilizing multiple processors operating in parallel, in order to increase the program execution speed, and the computer's capacity to process large amounts of data.

In addition, computer 1300 can include a display system 1314, that is connected to CPU 1312. Display system 1314, which can be remotely located, allows images to be displayed to the user, which allow the user to interact with the program being executed. Computer 1300 can also include a user-input system 1316, that is connected to CPU 1312. Input system 1316, which can be remotely located, allows the user to interact with the computer program being executed.

Furthermore, computer 1300 can also include a memory access device 1318, such as a disk drive or a networking card, that is connected to memory 1310 and CPU 1312. Memory access device 1318 allows the data from memory 1310 or CPU 1312 to be transferred to a computer-readable medium or a networked computer. In addition, device 1318 allows the programming instructions to be transferred to memory 1310, from the computer-readable medium or a networked computer.

In an alternative embodiment of the present invention, hardware circuitry may be used in place of, or in combination with, software instructions, to implement all or part of an embodiment of the present invention. As a result, the present invention is not limited to any specific combination of hardware circuitry and/or software instructions.

In accordance with the present invention, the detailed methods outlined in FIGS. 700-1000 can be summarized as follows. First, a logic synthesis program, which can run on computer 1300 or a similar device, performs element 810, and generates an unstitched, initial standard cell netlist (Netlist #1) in Verilog format.

Second, a scan test software program, which can run on computer 1300, reads Netlist #1, and performs elements 812, 814 and 816, replacing the D flipflops with scan flipflops, and non-optimally stitching the scan flipflops together, based upon their positions in the standard cell logic hierarchy. In addition, a first intermediate standard cell netlist (Netlist #2) is generated, in Verilog format.

Third, a Unix sed script, which can run on computer 1300, performs elements 818 and 820, by unstitching Netlist #2, and generating a second intermediate standard cell netlist (Netlist #3) from Netlist #2. Fourth, the scan test program performs element 822, by merging the second intermediate standard cell netlist (Netlist #3) with the macro blocks and I/O cells, to form the first chip-level Verilog netlist (Netlist #4).

Fifth, a place and route program, which can be run on computer 1300 or a similar device, reads Netlist #4, and performs elements 910 and 912, by generating a standard cell placement file that includes the instance names and the X,Y locations of all standard cells, including the scan flip-flops.

Sixth, the placement file from element #5 is read by a scan stitching pre-processor program, which can run on computer 1300 or a similar device. The scan stitching pre-processor program performs elements 1010-1020, by putting the scan flipflops into a scan stitching order, based upon their physical X,Y locations.

Seventh, the scan test program performs element 716, by stitching the scan flipflops together, in optimal scan order, and generating a new Verilog netlist (Netlist #5). Eighth, the scan test program merges Netlist #5 with the macro blocks and I/O cells, to form a second chip-level Verilog netlist (Netlist #6). Ninth, the place and route program performs elements 1210-1214, to generate the final wire routing for the entire chip.

It is important to note that, at the end of element 1212, the scan flipflops are placed in exactly the same physical positions where they were previously located, at the end of element 912. The only difference is that the scan flipflops in element 1212 are optimally stitched.

As part of element 1214, the place and route program can perform global routing and detail routing, connecting all of the on-chip nets, including the scan chain nets. The scan chain nets are connected according to the scan stitching order specified in the final chip-level Verilog netlist (Netlist #6).

In summary, FIGS. 7, 8, 9, 10 and 12 illustrate flow charts that describe a method of stitching scan flipflops together, according to embodiments of the present invention. Some of the elements illustrated in these figures may be performed sequentially, in parallel, or in an order other than that which is described. It should also be appreciated that in certain cases, some of the elements described may not have to be performed, and that additional elements may be added, and that some of the illustrated elements may be substituted with other elements.

In addition, embodiments of the present invention may be provided as a computer program, or as printed software instructions, or as software instructions on a machine accessible or machine readable medium. Furthermore, the software instructions on a machine accessible or machine readable medium may be used to program a computer system, or other electronic device.

Moreover, the machine-readable medium may include, but is not limited to, hard disks, floppy diskettes, optical disks, CD-ROMs, DVD disks, magneto-optical disks, or any other type of media/machine-readable medium suitable for storing and/or transmitting electronic instructions. Furthermore, the techniques described herein are not limited to any particular software configuration. Thus these techniques may find applicability in any computing or processing environment.

The terms "machine accessible medium" or "machine readable medium" used herein shall include any medium that is capable of storing, encoding, or transmitting a sequence of instructions for execution by machine, and that cause the machine to perform any one of the methods described herein. Furthermore, in the present state of the art, it is common to speak of software, in one form or another (e.g., program, procedure, process, application, module, unit, logic, and so on) as taking an action or causing a result. Such expressions are merely a shorthand way of stating that the execution of the software by a processing system causes the processing system to perform an action that produces a result.

It should be understood that the above descriptions are examples of the present invention, and that various alternatives of the invention described herein may be employed in practicing the invention. Thus, it is intended that the following claims define the scope of the invention, and that structures and methods within the scope of these claims and their equivalents be covered thereby.

What is claimed is:

1. A method of ordering scan flip-flops comprising:
    placing a group of scan flipflops in a scan order that is based on a physical placement of the scan flipflops in a two-dimensional standard cell placement region, placing the group of scan flipflops in the scan order including:
        partitioning the two-dimensional standard cell placement region into an array having a number of columns, a number of rows, and a number of intersections so that each column has a number of intersections, and each intersection is defined by a single column and a single row; and
        for each scan flipflop in the group, assigning a scan flipflop to an intersection based on the physical placement of the scan flipflop in the two-dimensional standard cell placement region, only one scan flipflop being assigned to a single intersection; and
    stitching using a computer the scan flipflops in the group together in the scan order to form a final scan chain.

2. The method of claim 1 and further comprising identifying a number of occupied columns by determining which of the columns are occupied, each occupied column having the number of intersections and a number of scan flipflops from the group, the number of intersections in an occupied column including a number of assigned intersections, the number of scan flipflops from the group being assigned to the number of assigned intersections.

3. The method of claim 2 and further comprising placing the number of occupied columns in an occupied column order, the occupied column order alternating between odd and even occupied columns.

4. The method of claim 3 and further comprising arranging the number of scan flipflops in each occupied column in a row order to generate a column list for each occupied column.

5. The method of claim 4 wherein the scan flipflops in the column list of each odd occupied column are arranged in ascending row order, and the scan flipflops in the column list of each even occupied column are arranged in descending row order.

6. The method of claim 4 and further comprising arranging the scan flipflops in the group in the scan order by sequentially placing the column list from each occupied column on a scan list in the occupied column order, the scan list defining the scan order.

7. The method of claim 1 and further comprising determining the physical placement of each scan flipflop in the group of scan flipflops in the two-dimensional standard cell placement region.

8. The method of claim 7 wherein determining the physical placement of each scan flipflop in the group includes:
    generating a flat netlist in response to a chip-level netlist, the chip-level netlist including the group of scan flip-flops, the group of scan flipflops being unstitched; and
    generating a placement file from the flat netlist, the placement file identifies each scan flipflop in the group of scan flipflops, and an X,Y location of each scan flipflop in the group of scan flipflops in the two-dimensional standard cell placement region.

9. The method of claim 8 wherein the chip-level netlist is generated by:
performing logic synthesis to generate an initial standard cell netlist, the initial standard cell netlist includes only non-scan flipflops; and
replacing a group of non-scan flipflops with the group of scan flip-flops.

10. The method of claim 9 and further comprising:
stitching together the group of scan flipflops using a conventional hierarchical stitching algorithm to form an initial scan chain;
generating a first intermediate standard cell netlist from the initial standard cell netlist after the group of scan flipflops has been stitched together; and
unstitching the scan flipflops in the first intermediate standard cell netlist.

11. The method of claim 10 and further comprising:
generating a second intermediate standard cell netlist from the first intermediate standard cell netlist after the group of scan flipflops has been unstitched; and
merging the second intermediate standard cell netlist with a number of macro blocks and a number of I/O cells to form the chip-level netlist.

12. The method of claim 1 and further comprising:
generating a final standard cell netlist that includes the scan flipflops in the group that have been stitched together in the scan order to form the final scan chain;
merging the final standard cell netlist with a number of macro blocks and a number of I/O cells to form a chip-level netlist; and
generating a routing layout based on the chip-level netlist.

13. A method of placing scan flipflops in a scan order comprising:
partitioning a two-dimensional standard cell placement region into an array having a number of columns, a number of rows, and a number of intersections so that each column has a number of intersections, and each intersection is defined by a single column and a single row; and
for a group of scan flipflops, assigning using a computer a scan flipflop to an intersection based on a physical placement of the scan flipflop in the two-dimensional standard cell placement region, only one scan flipflop being assigned to a single intersection.

14. The method of claim 13 and further comprising:
identifying a number of occupied columns by determining which of the columns are occupied, each occupied column having the number of intersections and a number of scan flipflops from the group, the number of intersections in an occupied column including a number of assigned intersections, the number of scan flipflops from the group being assigned to the number of assigned intersections; and
placing the number of occupied columns in an occupied column order, the occupied column order alternating between odd and even occupied columns.

15. The method of claim 14 and further comprising arranging the number of scan flipflops in each occupied column in a row order to generate a column list for each occupied column.

16. The method of claim 15 and further comprising arranging the scan flipflops in the group in the scan order by sequentially placing the column list from each occupied column on a scan list in the occupied column order, the scan list defining the scan order.

17. A non-transitory machine-readable medium having stored thereon sequences of instructions, the sequences of instructions including instructions which, when executed by a processor, causes the processor to perform:
placing a group of scan flipflops in a scan order that is based on a physical placement of the scan flipflops in a two-dimensional standard cell placement region, placing the group of scan flipflops in the scan order including:
partitioning the two-dimensional standard cell placement region into an array having a number of columns, a number of rows, and a number of intersections so that each column has a number of intersections, and each intersection is defined by a single column and a single row; and
for each scan flipflop in the group, assigning a scan flipflop to an intersection based on the physical placement of the scan flipflop in the two-dimensional standard cell placement region, only one scan flipflop being assigned to a single intersection; and
stitching the scan flipflops in the group together in the scan order to form a final scan chain.

18. A non-transitory machine-readable medium having stored thereon sequences of instructions, the sequences of instructions including instructions which, when executed by a processor, causes the processor to perform:
partitioning a two-dimensional standard cell placement region into an array having a number of columns, a number of rows, and a number of intersections so that each column has a number of intersections, and each intersection is defined by a single column and a single row; and
for a group of scan flipflops, assigning a scan flipflop to an intersection based on a physical placement of the scan flipflop in the two-dimensional standard cell placement region, only one scan flipflop being assigned to a single intersection.

* * * * *